United States Patent [19]

Fukuda et al.

[11] 4,154,025
[45] May 15, 1979

[54] METHOD FOR PREPARING OXIDE PIEZOELECTRIC MATERIAL WAFERS

[75] Inventors: Tsuguo Fukuda, Yokohama; Hitoshi Hirano, Kanagawa, both of Japan

[73] Assignee: Tokyo Shibaura Electric Co., Ltd., Kawasaki, Japan

[21] Appl. No.: 838,448

[22] Filed: Oct. 3, 1977

[30] Foreign Application Priority Data

Oct. 6, 1976 [JP] Japan .................. 51-119417

[51] Int. Cl.² .................................. B24B 1/00
[52] U.S. Cl. .................................. 51/283 R
[58] Field of Search .................... 51/283, 326; 125/12, 125/13, 14, 35; 29/25, 35

[56] References Cited

U.S. PATENT DOCUMENTS 2,487,091  11/1949  Barnes .................... 51/283
3,078,549  2/1963   Wende .................... 51/283 X

OTHER PUBLICATIONS

Festköreperprobleme XV, Advances in Solid State Physics, "Modern Silicon Technology," Hans Herrmann, et al., 1975.

*Primary Examiner*—Harold D. Whitehead
*Attorney, Agent, or Firm*—Flynn & Frishauf

[57] ABSTRACT

A method for preparing oxide piezoelectric material wafers from a rhombohedral single crystal of an oxide piezoelectric material as-grown cylindrically in the X-axis direction includes linearly rubbing-off at least one side portion of such as-grown cylindrical single crystal facing to a specified direction along the longitudinal direction of such single crystal before cutting X-cut wafers from such single crystal thereby to provide a corresponding flat portion.

7 Claims, 6 Drawing Figures

METHOD FOR PREPARING OXIDE PIEZOELECTRIC MATERIAL WAFERS

BACKGROUND OF THE INVENTION

This invention relates to a method for preparing wafers from a single crystal of an oxide piezoelectric material, more specifically to a method for cutting X-cut wafers from such single crystal.

The X-cut wafers obtained by cutting the single crystal of oxide piezoelectric material in a direction perpendicular to the X-axis are available as substrates of surface wave intermediate frequency filters for color television receivers, for example. For the convenience of cutting the X-cut wafers from the single crystal, such single crystal is generally produced and used in the form of a cylinder as-grown in the X-axis direction, that is, extending with the X-axis as the longitudinal direction. Such cylindrical single crystal may be produced by the pulling-up method, such as Czochralski method, or pulling-down method.

Now I will describe a typical example of conventional method for preparing X-cut wafers from the cylindrical single crystal of oxide piezoelectric material. (1) First, the Z-axis direction of the single crystal is determined by the X-ray Raue method or the like, and the single crystal is cut at the opposite curved sides by means of a diamond wheel to provide two planes perpendicular to the Z-axis (FIG. 1A). Such cutting is called Z-axis cutting. The length of the edge where an X-plane 2 of a single crystal 1 and each formed Z-plane 3 cross each other is required to be larger than the radius of the original cylinder. Poling is performed by applying a voltage of 5 to 10 V/cm between both Z-planes. Poling changes the as-grown multi-domain single crystal into a single-domain single crystal. (2) Secondly, the side portion is cut by means of a diamond wheel by a plane in parallel with $+112.2°$ Y-direction determined by the X-ray Raue method or the like to form an orientation flat 4 (FIG. 1B). (3) Finally, the single crystal is cut by means of a diamong wheel in a direction perpendicular to the X-axis and thus an X-cut wafer 5 with the orientation flat 4 is obtained.

According to the conventional method, the single crystals have frequently been cracked by Z-axis cutting, cutting for the formation of orientation flat, and/or cutting for obtaining wafers. In particular, cracks have been caused very often when large-diameter single crystals are cut along the Z-axis. The reason for this is that cylindrical as-grown single crystals involve accumulated distortion therein, and it is generally known that cracks are liable to be caused on a plane $<102>$ upon which distortion is centered. Such outbreak of cracks in cutting would reduce substantially the yield rate of wafers, thereby prominently raising the production cost of resultant wafers.

Further, the surface area of the X-cut wafer prepared by the above-mentioned conventional method was revealed to be only equivalent to approximately 85% of that of the X-plane of the cylindrical as-grown single crystal, which meant nothing but want of economy.

An object of this invention is to provide a method for preparing wafers from a rhombohedral single crystal of an oxide piezoelectric material at a high yield rate as well as with high efficiency.

Another object of the invention is to prevent cracks from being caused when cutting the cylindrical single crystal.

SUMMARY OF THE INVENTION

The method for preparing wafers of the invention is a method for preparing X-cut wafers from a rhombohedral single crystal of a cylindrical oxide piezoelectric material with its longitudinal direction coincident with the X-axis direction, characterized by including linearly rubbing-off at least one side portion of such as-grown cylindrical single crystal facing to a specified direction along the longitudinal direction of such single crystal thereby to provide a corresponding flat portion. Such specified direcon may include at least one direction in ranges within $\pm15°$ from $<102>$ and $\pm15°$ from a direction perpendicular to $<102>$.

DETAILED DESCRIPTION

The single crystal of an oxide piezoelectric material to which the method of this invention can be applied is a rhombohedral cylindrical single crystal with its longitudinal direction coincident with the X-axis thereof. The oxide piezoelectric materials include lithium tantalate, lithium niobate, lithium tantalate-niobate, and other materials including these compounds with suitable impurities added thereto. The cylindrical single crystal with the longitudinal direction coincident with the X-axis may, like the conventional one, be produced by the pulling-up method, such as Czochralski method, or pulling-down method.

Figure 1A:
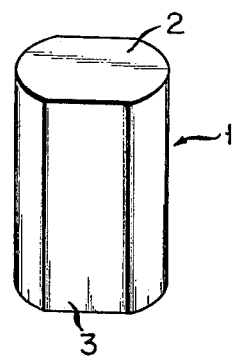
FIG. 1A is a perspective view of the single crystal Z-axis-cut by the conventional method.
Figure 1B:
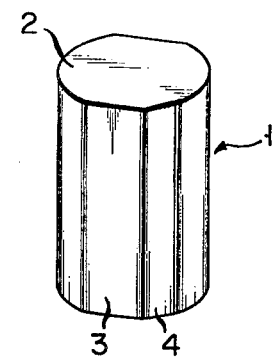
FIG. 1B is a perspective view of the single crystal of FIG. 1A with the orientation flat formed additionally.
Figure 1C:
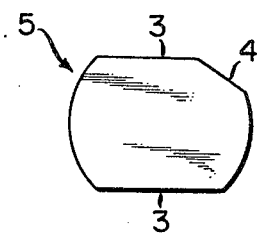
FIG. 1C is a perspective view of the conventional X-cut wafer cut from the single crystal of FIG. 1B.
Figure 2:
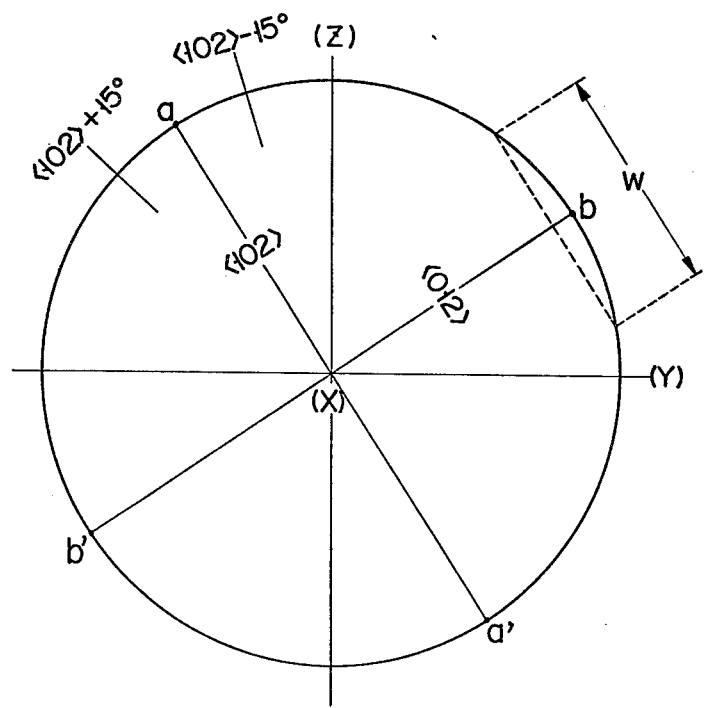
FIG. 2 is a stereo projection drawing in an orientation perpendicular to the X-axis of the single crystal for illustrating the direction of rubbing-off according to the method of this invention.
Figure 3:
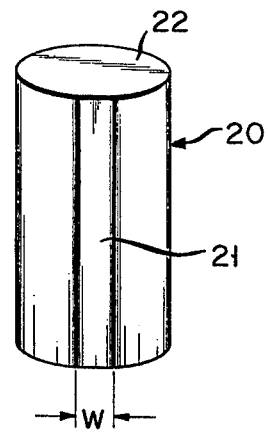
FIG. 3 is a perspective view of the single crystal with the strip-shaped flat portion formed by rubbing-off a part of the side portion thereof according to the method of the invention.

The cylindrical single crystal produced by such method involes a great many distortions therein. The inventors now have found that such distortions may be removed by rubbing-off at least one side portion of the cylindrical single crystal facing to a direction $<102>$ or a direction perpendicular thereto along the longitudinal direction of such single crystal, eliminating cracks in the single crystal which may otherwise be caused in the subsequent cutting process. In FIG. 2, a stereo projection drawing of the single crystal in an orientation perpendicular to the X-axis, at least one portion out of side portions a and a' in the direction $<102>$ and side portions b and b' in the direction perpendicular to $<102>$, that is, direction $<012>$ is rubbed off along the longitudinal direction. Further, it has been found that substantially the same effect may be obtained by rubbing-off any side portions in a range within $\pm15°$ from these directions. These directions are determined by the X-ray Raue method, X-ray diffraction method or the like. By such rubbing-off, as shown in FIG. 3, there is formed a strip-shaped flat portion 21 extending along the longitudinal direction of a cylindrical single crystal 20.

Figure 4:
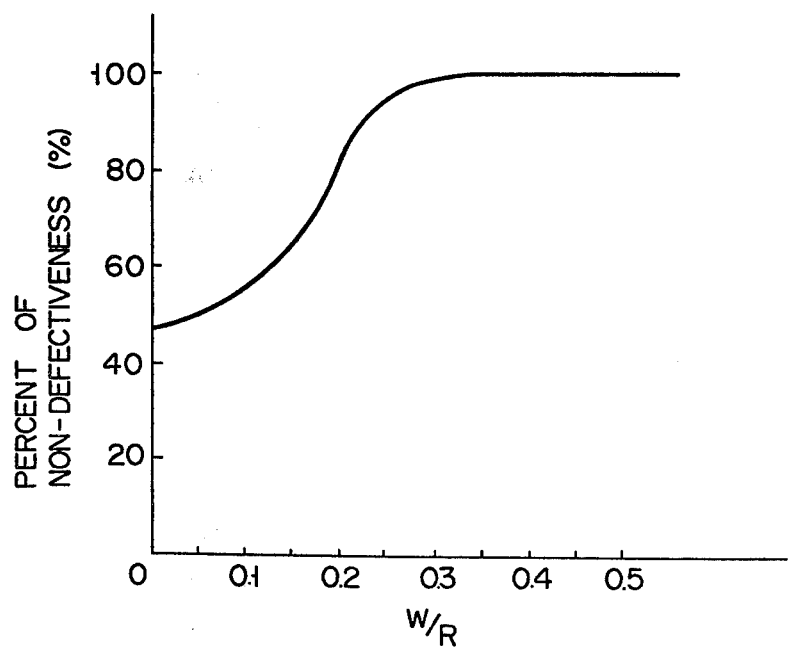
FIG. 4 is a graph showing the relation between the ratio w/R of the rubbing-off width w to the diameter R of the single crystal and the percent of non-defectiveness in the orientation flat cutting process after rubbing-off.

The length w of an edge where the flat portion 21 and an X-plane cross each other (hereinafter referred to as rubbing-off width) depends on the diameter R of the single crystal. The yield rate of X-cut wafers may be substantially improved by using the ratio w/R of 0.2 and above. If w/R exceeds 0.5, however, the surface area of an obtained X-cut wafer will become extremely small and rubbing-off will require too much time, leading to want of economy. Therefore, w/R used should range from 0.2 to 0.5, preferably from 0.3 to 0.4. FIG. 4 shows test results illustrating the relation between w/R and the fraction of non-defectiveness at the stage of the orientation flat cutting process.

According to the method of the invention, the method for rubbing-off a specified side portion of the cylindrical single crystal is not expressly limited, though the following methods are preferred to attain more economical rubbing-off speed. For example, while fixing the single crystal with a side portion to be rubbing-off upward, such side portion is polished by means of a tool with powdered diamond or aluminum oxide attached to the bottom face thereof. In doing this, a cup-shaped tool may be rotated over the side portion or otherwise an alternatively shaped tool may be rubbed back and forth against such portion. When using the cup-shaped tool, the resolving speed of the tool should preferably be at nearly 2,000 to 4,000 rpm, while the moving speed of the tool in the longitudinal direction of the single crystal should preferably be at nearly 5 mm/min. Under these conditions, it takes nearly 15 minutes to rubbing off a side portion of single crystal of 50 mm length and 50 mm diameter with the rubbing-off width fixed at 10 mm. Also, when using other types of tools for rubbing-off, the speed of oscillation and the longitudinal moving speed of the tool should preferably be at nearly 2,000 to 4,000 cycles/min and nearly 5 mm/min respectively.

Cutting with a diamond wheel or the like may not be substituted for such rubbing-off, because it cannot thoroughly eliminate the distortions involved in the single crystal. When the side portion of the cylindrical single crystal facing to the direction <102> is cut or rubbed off with w/R of 0.3, the incidence of cracks in the subsequent orientation flat cutting process was approximately 43% with the cut single crystal, while it was 0% with the rubbing-off single crystal according to the invention.

Moreover, if the single crystal, with a part of the side portion thereof rubbed-off, is annealed at a temperature of nearly 1,000° C. and above, the distortions will be eliminated further, producing more desirable results.

Thereafter, the single crystal, with the side portion facing to the specified direction rubbed-off according to this invention, may be subjected to Z-axis cutting, cutting for making the orientation flat, and then cutting into X-cut wafers in the same manner as the conventional one. According to this invention, the single crystal is subject to hardly any cracks in these cutting processes. Further, according to Japan Pat. Appl. No. 139516/76 filed on Nov. 22, 1976, the single crystal may be conveniently poled in the form of a cylinder without Z-axis cutting.

Now I will describe the invention in detail with reference to examples.

EXAMPLE 1

A cylindrical single crystal of lithium tantalate of 40 mm length and 40 mm diameter was prepared by the Czochralski method. This cylindrical single crystal was so grown as to bring the longitudinal direction thereof into direction of the X-axis. The direction <102> of the cylindrical single crystal was determined by the X-ray Raue method. The cylindrical single crystal was attached to a tool, and the side portion facing to the direction <102> was rubbed off with the rubbing-off width of 10 mm. Using a cup-shaped tool with powdered diamond, rubbing-off (or grinding-off) was performed for nearly 15 minutes at a revolving speed of 3,000 rpm and a moving speed in the longitudinal direction of the single crystal of 5 mm/min.

Thereafter, the single crystal was subjected to Z-axis cutting and poled for single-domain construction. Then an orientation flat was formed by cutting the single crystal along the +112.2° Y-direction. Finally, the single crystal was cut in the direction perpendicular to the X-axis and X-cut wafers of 0.5 mm thickness were prepared. 40 X-cut wafers were obtained from one single crystal without causing any cracks.

Meanwhile, according to the conventional method of preparation, 25 X-cut wafers were obtained from a cylindrical single crystal as large as the aforesaid one. Thus, the yield rate of wafers in the method of this invention was found to be 1.6 times as high as that in the conventional method.

EXAMPLE 2

A cylindrical single crystal as large as that of Example 1 was prepared by the same method as in Example 1. This single crystal, as kept in the form of a cylindrical as-grown crystal, was converted into a single-domain crystal by the method as mentioned in Japan Pat. Appl. No. 139516/76. Thereafter, a direction inclined at +15° from the direction <102> was obtained by the X-ray Raue method, and the side portion of the single crystal facing to such inclined direction was rubbed off with the rubbing-off width of 15 mm in the same manner as in Example 1. Then an orientation flat was formed by cutting the single crystal along the +112.2° Y-direction. At this time no cracks were caused by cutting. Subsequently, X-cut wafers of 0.5 mm thickness were cut from the single crystal. There were obtained 40 wafers with no cracks. From each wafer could be prepared 25 substrates with dimensions of 2.7 mm × 10 mm. Thus, 1,000 substrates were obtained from one cylindrical single crystal.

On the other hand, when X-cut wafers were prepared in the same manner as mentioned above except that the rubbing-off was not carried out, only 25 wafers could be obtained from a cylindrical single crystal of the same size as a result of the outbreak of cracks. 25 substrates with the above dimensions were prepared from each of the X-cut wafers. Thus, only 625 substrates could be obtained from one cylindrical single crystal.

Further, when a single crystal was subjected to Z-axis cutting for poling according to the conventional method, only 18 substrates with the above dimensions could be prepared from each X-cut wafer because of its narrow surface area. Thus, only 450 or less substrates could be obtained from one cylindrical single crystal.

EXAMPLE 3

Preparation was performed in the same manner as in Example 2 except that the side portion facing to a direction inclined at +15° from the direction perpendicular to <102> was rubbed off. There were obtained just the same results as those of example 2.

What we claim is:

1. A method for preparing oxide piezoelectric material wafers by cutting an anisotropic rhombohedral cylindrical single crystal of an oxide piezoelectric material with the longitudinal direction conincident with the X-axis thereof, comprising rubbing-off at least one side portion of said rhombohedral cylindrical single srystal as-grown facing to at least one direction among a direction <102>, a direction perpendicular to said direction <102>, and directions involved in a range within ±15° from said two directions to form a strip-shaped flat portion along the longitudinal direction of said cylindrical single crystal, and thereafter cutting an X-cut wafer from said single crystal.

2. A method according to claim 1, wherein the ratio (w/R) of a rubbing-off width w to the diameter R of said single crystal ranges from 0.2 to 0.5.

3. A method according to claim 2, wherein said ratio (w/R) ranges from 0.3 to 0.4.

4. A method according to claim 1, wherein said single crystal with a part of said side portion rubbed off is subsequently annealed at a temperature of approximately 1,000° C. and above.

5. A method according to claim 1, wherein said oxide piezoelectric material is at least one among lithium tantalate, lithium niobate, and materials including said compounds with impurities added thereto.

6. A method according to claim 1, wherein said step of rubbing-off comprises polishing said at least one side surface of said cylindrical single crystal to form said strip-shaped flat portion.

7. A method according to claim 1, wherein said step of rubbing-off comprises grinding said at least one side portion of said cylindrical single crystal to form said strip-shaped flat portion.

* * * * *

UNITED STATES PATENT AND TRADEMARK OFFICE
CERTIFICATE OF CORRECTION

PATENT NO. : 4,154,025
DATED : May 15, 1979
INVENTOR(S) : Tsuguo Fukuda et al

It is certified that error appears in the above-identified patent and that said Letters Patent are hereby corrected as shown below:

Column 5, (claim 1), line 14, after "cylindrical single" "srystal" should read -- crystal --

Column 5, (claim 1), line 12, after "direction", "conincident" should read -- coincident --

Signed and Sealed this

Thirtieth Day of October 1979

[SEAL]

Attest:

RUTH C. MASON
Attesting Officer

LUTRELLE F. PARKER
Acting Commissioner of Patents and Trademarks